(12) United States Patent
Rabinovitch et al.

(10) Patent No.: US 8,798,129 B2
(45) Date of Patent: Aug. 5, 2014

(54) BIQUAD INFINITE IMPULSE RESPONSE SYSTEM TRANSFORMATION

(75) Inventors: Alexander Rabinovitch, Kfar Yona (IL); Leonid Dubrovin, Karney Shomron (IL)

(73) Assignee: LSI Corporation, San Jose, CA (US)

( * ) Notice: Subject to any disclaimer, the term of this patent is extended or adjusted under 35 U.S.C. 154(b) by 140 days.

(21) Appl. No.: 13/343,591

(22) Filed: Jan. 4, 2012

(65) Prior Publication Data

US 2013/0170585 A1    Jul. 4, 2013

(51) Int. Cl.
H03H 7/30 (2006.01)

(52) U.S. Cl.
USPC ............ 375/233; 375/316; 375/230; 375/229

(58) Field of Classification Search
CPC .... H04B 1/0003; H04B 15/02; H04B 1/0475; H04L 27/00
USPC .................................. 375/316, 233, 230, 229
See application file for complete search history.

(56) References Cited

U.S. PATENT DOCUMENTS

| | | | | |
|---|---|---|---|---|
| 4,107,470 A * | 8/1978 | Maruta | ............................ | 380/28 |
| 5,835,895 A * | 11/1998 | Stokes, III | ..................... | 704/500 |
| 6,232,900 B1 * | 5/2001 | Hendricks et al. | ............ | 341/143 |
| 6,584,481 B1 * | 6/2003 | Miller | ........................... | 708/320 |
| 6,664,913 B1 * | 12/2003 | Craven et al. | ................. | 341/200 |
| 6,845,135 B2 | 1/2005 | Du | | |
| 8,090,144 B2 * | 1/2012 | Chang et al. | .................. | 382/100 |
| 8,150,069 B2 * | 4/2012 | Nakano | .......................... | 381/103 |
| 8,355,513 B2 * | 1/2013 | Burge et al. | .................. | 381/71.6 |
| 2005/0076073 A1 * | 4/2005 | Gurrapu | ........................ | 708/300 |
| 2006/0068710 A1 * | 3/2006 | Jensen | .......................... | 455/63.1 |
| 2006/0251199 A1 * | 11/2006 | Machesney | ................... | 375/350 |
| 2007/0220077 A1 * | 9/2007 | Miller | ........................... | 708/300 |
| 2008/0071846 A1 * | 3/2008 | Sadafale et al. | .............. | 708/313 |
| 2008/0120356 A1 * | 5/2008 | Watanabe | ...................... | 708/320 |
| 2009/0030961 A1 * | 1/2009 | Matsuyama et al. | .......... | 708/320 |
| 2009/0304130 A1 * | 12/2009 | Umari et al. | ................... | 375/345 |
| 2009/0319066 A1 * | 12/2009 | Tsuji et al. | ....................... | 700/94 |
| 2010/0246831 A1 * | 9/2010 | Mahabub et al. | ............... | 381/17 |

* cited by examiner

*Primary Examiner* — Kenneth Lam
(74) *Attorney, Agent, or Firm* — Otterstedt, Ellenbogen & Kammer, LLP

(57) ABSTRACT

A BIIR system includes a first delay line for receiving at least one input data sample and generating delayed input samples as a function of the input data sample. The BIIR system further includes a second delay line including multiple delay elements connected in series for generating delayed output samples. An input of one of the delay elements receives at least one output data sample of the BIIR system. A summation element in the BIIR system generates the output data sample of the BIIR system as a function of an addition of at least first and second signals and a subtraction of at least a third signal. The third signal includes a first delayed output sample generated by the second delay line multiplied by a first prescribed value. The first delayed output sample and the output data sample are temporally nonadjacent to one another.

21 Claims, 6 Drawing Sheets

FIG. 3

| y[n-1]=-a1*y[n-2]+Temp1[n-1]+Temp2[n-1] | Temp1[n]=-a2*y[n-2] | Temp2[n]=A*x[n] |

CYCLE T

| y[n]=-a1*y[n-1]+Temp1[n]+Temp2[n] | Temp1[n+1]=-a2*y[n-1] | Temp2[n+1]=A*x[n+1] |

CYCLE T+1

| y[n+1]=-a1*y[n]+Temp1[n+1]+Temp2[n+1] | Temp1[n+2]=-a2*y[n] | Temp2[n+2]=A*x[n+2] |

CYCLE T+2

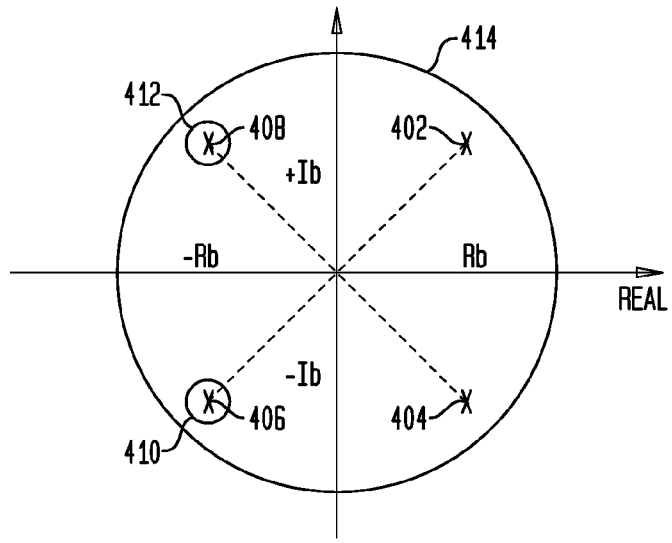

| | y[n-2]=-q1*y[n-4]+Temp1[n-2]+Temp2[n-2]<br>+Temp3[n-2]+Temp4[n-2] | | |
|---|---|---|---|
| Temp1[n]=-q2*y[n-4] | Temp2[n]=A*x[n] | Temp3[n]=p1*x[n-1] | Temp4[n]=p2*x[n-2] |

CYCLE T

| | y[n-1]=-q1*y[n-3]+Temp1[n-1]+Temp2[n-1]<br>+Temp3[n-1]+Temp4[n-1] | | |
|---|---|---|---|
| Temp1[n+1]=-q2*y[n-3] | Temp2[n+1]=A*x[n+1] | Temp3[n+1]=p1*x[n] | Temp4[n+1]=p2*x[n-1] |

| | y[n]=-q1*y[n-2]+Temp1[n]+Temp2[n]<br>+Temp3[n]+Temp4[n] | | |
|---|---|---|---|
| Temp1[n+2]=-q2*y[n-2] | Temp2[n+2]=A*x[n+2] | Temp3[n+2]=p1*x[n+1] | Temp4[n+2]=p2*x[n] |

CYCLE T+1

| | y[n+1]=-q1*y[n-1]+Temp1[n+1]+Temp2[n+1]<br>+Temp3[n+1]+Temp4[n+1] | | |
|---|---|---|---|
| Temp1[n+3]=-q2*y[n-1] | Temp2[n+3]=A*x[n+3] | Temp3[n+3]=p1*x[n+2] | Temp4[n+3]=p2*x[n+1] |

800

BIQUAD INFINITE IMPULSE RESPONSE SYSTEM TRANSFORMATION

FIELD OF THE INVENTION

The present invention relates generally to the electrical, electronic, and computer arts, and more particularly relates to infinite impulse response systems.

BACKGROUND

Infinite impulse response (IIR) digital filters, and in particular, biquad infinite impulse response (BIIR) filters, have been widely used in the field of communications, among other applications. For example, such digital filters are often used to remove noise, enhance communication signals, and/or synthesize communication signals. Compared to a finite impulse response (FIR) filter, an IIR filter is generally much more efficient in terms of achieving certain performance characteristics with a given filter order. This is primarily because an IIR filter incorporates feedback and is capable of realizing both poles and zeros of a system transfer function, whereas an FIR filter can only realize zeros of a transfer function. Moreover, IIR filters use a smaller number of coefficients to obtain a required impulse response of a desired filter.

Higher order IIR filters can be obtained by cascading multiple biquad IIR filters with appropriate coefficients. Another way to design higher-order IIR filters is to employ a single complex section. This latter approach is often referred to as a direct form implementation. The cascaded biquad implementation generally executes slower than the direct form implementation but generates smaller numerical errors than the direct form implementation. Another disadvantage of the direct form implementation is that the poles of such single-stage high-order polynomials get increasingly sensitive to quantization errors; second-order polynomial sections (i.e., biquads) are less sensitive to quantization effects.

One significant disadvantage of a BIIR implementation in a vector processor environment is a requirement for sequential processing of output samples. Conventional direct form implementation BIIR filter implementations utilize only a relatively small subset (e.g., three) of the total number of multipliers available. This implementation is inefficient, and is prone to execution stalls, and hence is undesirable.

SUMMARY

Principles of the invention, in illustrative embodiments thereof, advantageously provide techniques for eliminating the requirement for sequential processing of output samples in a BIIR system. In this manner, techniques of the invention advantageously optimize the processing efficiency and performance of a BIIR system, such as a BIIR filter, particularly in a vector processor environment.

In accordance with one embodiment of the invention, a BIIR system includes a first delay line for receiving at least one input data sample and generating delayed input samples as a function of the input data sample. The BIIR system further includes a second delay line including multiple delay elements connected together in a series configuration for generating delayed output samples. An input of one of the delay elements receives at least one output data sample of the BIIR system. A summation element in the BIIR system generates the output data sample of the BIIR system as a function of an addition of at least first and second signals and a subtraction of at least a third signal. The third signal includes at least a first delayed output sample generated by the second delay line multiplied by a first prescribed value. The first delayed output sample and the output data sample of the BIIR system are temporally nonadjacent to one another, whereby the BIIR system eliminates a dependency between the output data sample and a temporally adjacent delayed output sample generated by the second delay line. One or more BIIR systems can be implemented in an integrated circuit.

In accordance with another embodiment of the invention, a method of implementing a BIIR system includes the steps of: generating a plurality of delayed input samples as a function of an input data sample received by the BIIR system; generating a plurality of delayed output samples as a function of at least one output data sample of the BIIR system; generating the output data sample of the BIIR system by summing at least a first signal and a second signal and subtracting at least a third signal, the third signal comprising at least a first one of the delayed output samples multiplied by a first prescribed value, the first one of the delayed output samples and the output data sample of the BIIR system being temporally nonadjacent to one another, whereby the BIIR system is operative to eliminate a dependency between the output data sample and a temporally adjacent delayed output sample.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals indicate corresponding elements throughout the several views, and wherein:

FIG. 3 is a conceptual view depicting three processor cycles along with exemplary operations performed during each of the cycles in a direct implementation of a BIIR filter;

FIG. 4 is a graphical illustration depicting pole locations for the exemplary transformed BIIR filter, according to an embodiment of the invention;

FIG. 5 is a conceptual view depicting two consecutive processor cycles along with exemplary operations performed during each of the cycles in an implementation of an illustrative transformed BIIR filter, according to an embodiment of the invention;

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Embodiments of the present invention will be described herein in the context of illustrative methods and apparatus for efficiently implementing a BIIR filter. It is to be appreciated, however, that the invention is not limited to the specific methods and apparatus illustratively shown and described herein. Rather, embodiments of the invention are directed broadly to techniques for eliminating the sequential processing of output samples in a BIIR system. Moreover, it will become apparent to those skilled in the art given the teachings herein that numerous modifications can be made to the embodiments shown that are within the scope of the present invention. That is, no limitations with respect to the specific embodiments described herein are intended or should be inferred.

A BIIR transfer function is typically represented in one of the following forms:

$$H(z) = \frac{A}{1 + a_1 z^{-1} + a_2 z^{-2}} = \frac{A}{(1 - b_1 z^{-1})(1 - b_2 z^{-1})} \quad (1)$$

$$y[n] = -a_1 y[n-1] a_2 y[n-2] + Ax[n] \quad (2)$$

where $a_1$ and $a_2$ are filter coefficients, which are usually real numbers, $b_1$ and $b_2$ are locations of filter poles, which are usually complex numbers such that $b_1 = R_b + I_b i$ and $b_2 = R_b - I_b i$ ($i = \sqrt{-1}$), $y[n]$ is the calculated filter output, and $y[n-1]$ and $y[n-2]$ are previously calculated filter outputs (i.e., the two calculated output samples immediately preceding $y[n]$). Equation (1) is considered a z-transform form and equation (2) is a regression equation form.

IIR is a property of signal processing systems. Systems with this property are known as IIR systems or, when dealing with filter systems in particular, as IIR filters. IIR systems have an impulse response function that is non-zero over an infinite length of time. This is in contrast to finite impulse response (FIR) filters, which have fixed-duration impulse responses.

Figure 1:
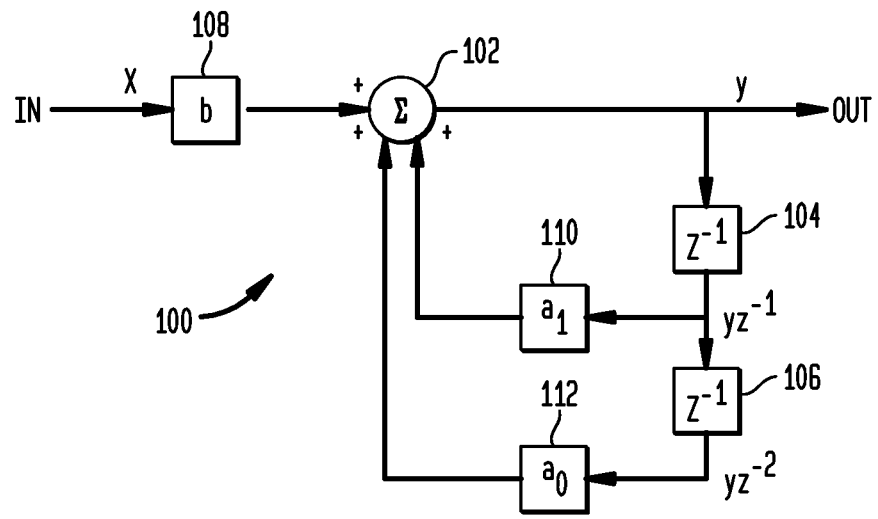
FIG. 1 is a block diagram depicting at least a portion of an exemplary second order IIR filter 100 which can be modified to implement techniques of the invention.

FIG. 1 is a block diagram depicting at least a portion of an exemplary second order IIR filter 100 which can be modified to implement techniques of the invention. It is to be understood that the invention is not limited to any specific IIR filter topology, and that the coefficients and number of feedback/feedforward paths in the filter are implementation-dependent. In this example, IIR filter 100 includes a summation block 102, a first delay block 104 and a second delay block 106 connected together in a recursive configuration. Summation block 102 is operative to receive an input signal (x) supplied thereto and to generate an output signal (y) of the filter via a feedforward signal path. Delayed versions of the output signal y, generated by delay blocks 104 and 106, are fed back to summation block 102, via separate feedback signal paths, and summed with the input signal x to generate the filter output signal y.

More particularly, input signal x is multiplied in block 108 by a coefficient (i.e., constant) b to generate the signal bx supplied to summation block 102. The output signal y is fed to the first delay block 104 to generate a delayed output signal $yz^{-1}$, which is multiplied by a coefficient $a_1$ to generate a signal $a_1 yz^{-1}$. The signal $a_1 yz^{-1}$ is then supplied to summation block 102 via a first feedback signal path. Concurrently, the signal $yz^{-1}$ generated by the first delay block 104 is fed to the second delay block 106 to generate a delayed output signal $yz^{-2}$, which is multiplied by a coefficient $a_0$ to generate a signal $a_0 yz^{-2}$. The signal $a_0 yz^{-2}$ is then supplied to summation block 102 via a second feedback signal path. In this manner, the output signal y can be represented as follows:

$$y = bx + a_0 yz^{-1} + a_1 yz^{-2} \quad (3)$$

Solving equation (3) for the filter transfer function H(z) yields the following derivation:

$$\begin{aligned} bx &= y - a_1 z^{-1} y - a_0 z^{-2} y \\ bx &= y(1 - a_1 z^{-1} - a_0 z^{-2}) \\ \frac{x}{y} &= \frac{b}{1 - a_1 z^{-1} - a_0 z^{-2}} \\ H(z) &= \frac{x}{y} = \frac{bz^2}{z^2 - a_1 z^{-1} - a_0} \end{aligned} \quad (4)$$

Figure 2:
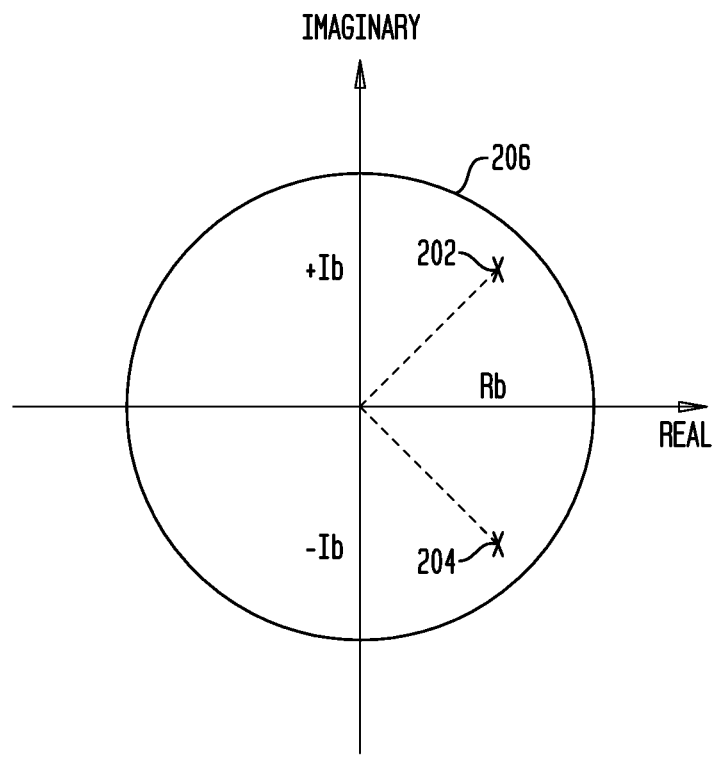
FIG. 2 is a graphical illustration depicting pole locations for an exemplary BIIR filter.

FIG. 2 is a graphical illustration depicting pole locations for an exemplary BIIR filter. With reference to FIG. 2, a first pole 202 is located at a position of $R_b$ on the real axis and $I_b$ on the imaginary axis, and a second pole 204 is located at a position of $R_b$ on the real axis and $-I_b$ on the imaginary axis. As shown, the location of all poles lie within the boundary of a unit circle 206, which is a fundamental requirement of any IIR filter since it assures filter stability. More particularly, the system transfer function allows one to judge whether or not the system is bounded-input, bounded-output (BIBO) stable. A BIBO stability criterion requires that a radius of convergence (ROC) of the system includes the unit circle. For example, for a causal system, all poles of the transfer function must have an absolute value smaller than one; i.e., all poles must be located within the boundary of the unit circle 206 in a z-plane.

As will be understood by those skilled in the art, the poles are defined as values of z which make the denominator of the transfer function H(z) equal to 0; in other words:

$$0 = \sum_{j=0}^{Q} a_j z^{-j},$$

where Q represents the IIR feedback filter order. Clearly, if $a_j$ is not equal to zero, then the poles are not located at the origin of the z-plane. This is in contrast to the FIR filter where all poles are located at the origin, and thus the ZFIR filter is always stable.

As previously stated, a significant disadvantage of a conventional BIIR filter implementation in a vector processor environment is a requirement for sequential processing of output samples. Conventional BIIR filter implementations utilize only a small subset (e.g., three) of the total number of multipliers available (e.g., 16). This implementation is inefficient, is prone to execution stalls, and is therefore undesirable.

As seen in equation (2) above, there is a direct correlation between the calculation of previous sample y[n−1] and output sample y[n]. Assume the BIIR filter is implemented in hardware (e.g., a vector processor) that is operative to execute several multiply accumulate (MAC) operations in a single cycle (e.g., 16 multipliers in the case of LSI vector processor VP16, or 32 multipliers in the case of CEVA-XC323, commercially available from CEVA, Inc., Mountain View, Calif.). Execution problems associated with this approach are illustrated in conjunction with FIG. 3.

By way of example only and without loss of generality, FIG. 3 is a conceptual view depicting three consecutive processor cycles, namely, cycles T, T+1 and T+2, along with exemplary operations performed during each of the cycles in a direct implementation of the illustrative BIIR filter. The duration of each cycle in absolute time is not critical to the invention and is therefore not explicitly shown. With reference to FIG. 3, in cycle T, the following illustrative calculations are performed:

$$y[n-1]=a1*y[n-2]+Temp1[n-1]+Temp2[n-1];$$

$$Temp1[n]=-a2*y[n-2];$$

$$Temp2[n]=A*x[n].$$

In cycle T+1, the following illustrative calculations are performed:

$$y[n]=-a1*y[n-1]+Temp1[n]+Temp2[n];$$

$$Temp1[n+1]=-a2*y[n-1];$$

$$Temp2[n+1]=A*x[n+1].$$

Likewise, in cycle T+2, the following illustrative calculations are performed:

$$y[n+1]=-a1*y[n]+Temp1[n+1]+Temp2[n+1];$$

$$Temp1[n+2]=-a2*y[n];$$

$$Temp2[n+2]=A*x[n+2].$$

As seen from the above operations, direct implementation of a standard BIIR utilizes only three multipliers out of all available multipliers during any given processor cycle. Most modern vector processors include a substantially greater number of available multipliers (e.g., 16, in the illustrative case of a VP16 vector processor), and thus a standard BIIR implementation utilizing only three multipliers in a given cycle results in an inefficient approach, at least in terms of resource allocation. In addition, this direct implementation of the BIIR filter can cause execution stalls in every cycle if MAC (i.e., multiply accumulate) operations are performed in more than one pipe stage, which is a practical scenario. Thus, for efficiency purposes, it would be desirable to implement the BIIR filter (or alternative BIIR system) in a manner which beneficially utilizes all, or at least a larger subset, of the available multipliers in a given vector processor system.

In order to achieve greater processing efficiency and speed, among other advantages, embodiments of the invention provide an implementation of the BIIR filter that beneficially eliminates the above-noted dependency between y[n] and y[n−1] samples. Additionally, the novel transformation methodology preserves the stability and accuracy of the BIIR filter. While embodiments of the invention are described herein with specific reference BIIR filters, it will become apparent to those skilled in the art given the teachings herein that techniques of the invention are applicable to IIR systems in general. Additional systems that can be modified according to embodiments of the invention include, but are not limited to, generally any auto-regressive moving-average (ARMA) system. A BIIR filter represents merely one simple illustration which achieves significant benefits over conventional approaches.

As previously stated, a standard BIIR filter can be represented by at least one of the following expressions:

$$H(z) = \frac{A}{1 + a_1 z^{-1} + a_2 z^{-2}} =$$

$$\frac{A}{(1 - b_1 z^{-1})(1 - b_2 z^{-1})} = \frac{A}{(1 - (R_b + I_b)z^{-1}(1 - (R_b + I_b)z^{-1})}$$

$$y[n] = -a_1 y[n-1] - a_2 y[n-2],$$

where $a_1$ and $a_2$ are filter coefficients, which are typically real numbers, $b_1$ and $b_2$ are respective locations of the filter poles, which are typically complex numbers ($b_1=R_b+I_b$ and $b_2=R_b-I_b$), y[n] is the calculated filter output, and y[n−1] and y[n−2] are previously calculated filter outputs. It is to be appreciated that, although aspects of the invention are described herein with reference to a second order BIIR filter, the invention is not limited to any specific filter order. Rather, techniques of the invention can be applied to BIIR systems other than second order, as will become apparent to those skilled in the art given the teachings herein.

In accordance with an embodiment of the invention, both the numerator and denominator of the transfer function H(z) shown in equation (2) are multiplied by $(1+b_1 z^{-1})*(1+b_2 z^{-1})$ in the following manner:

$$H(z) = \frac{A(1 + b_1 z^{-1})(1 + b_2 z^{-1})}{(1 - b_1 z^{-1})(1 - b_2 z^{-1})(1 + b_1 z^{-1})(1 + b_2 z^{-1})} \quad (5)$$

$$H(z) = \frac{A(1 + (b_1 + b_2)z^{-1} + b_1 b_2 z^{-2})}{(1 - b_1^2 z^{-2})(1 - b_2^2 z^{-2})}$$

$$H(z) = \frac{A(1 + (b_1 + b_2)z^{-1} + b_1 b_2 z^{-2})}{(1 - b_1^2 + b_2^2)z^{-2} + b_1^2 b_2^2 z^{-4}}$$

Letting $p_1=A(b_1+b_2)$, $p_2=A(b_1*b_2)$, $q_1=-(b_1^2+b_2^2)$, and $q_2=(b_1^2*b_2^2)$, and substituting $p_1$, $p_2$, $q_1$ and $q_2$ into equation (5) above, the following expression for the transfer function H(z) of the transformed BIIR filter is obtained:

$$H(z) = \frac{A + p_1 z^{-1} + p_2 z^{-2}}{1 + q_1 z^{-2} + q_2 z^{-4}} \quad (6)$$

Equation (6) above can be rewritten in regression equation form as follows:

$$y[n]=-q_1 y[n-2]-q_2 y[n-4]+Ax[n]+p_1 x[n-1]+p_2 x[n-2] \quad (7)$$

In a z-transform plane, the illustrative transformed BIIR filter represented by equation (7) comprises four poles and two zeros. To ensure that the transformed BIIR filter is stable, all poles must reside within the boundary of a unit circle, as previously stated. FIG. 4 is a graphical illustration depicting pole and zero locations for the exemplary transformed BIIR filter, according to an embodiment of the invention. The transformed BIIR filter is represented in the z-plane as having four poles, namely, a first pole 402, a second pole 404, a third pole 406 and a fourth pole 408, and two zeros, namely, a first zero 410 and a second zero 412. As apparent from FIG. 4, all poles 402, 404, 406 and 408 of the transformed BIIR filter have an absolute value smaller than one; i.e., all poles are located within the boundary of a unit circle 414 in the z-plane, thus satisfying the BIBO stability criterion.

As is seen in equation (7) above, there is no direct dependency between the calculation of samples y[n−1] and y[n]. A dependency exists only between the calculation of samples y[n−2] and y[n]. This approach provides enhanced calculation efficiency for a BIIR system compared to conventional methodologies.

By way of example only and without loss of generality, FIG. 5 is a conceptual view depicting two consecutive processor cycles, namely, cycles T and T+1, along with exemplary operations performed during each of the cycles in an implementation of an illustrative transformed BIIR filter, according to an embodiment of the invention. The duration of each cycle in absolute time is not critical to the invention and is therefore not explicitly shown. With reference to FIG. 5, in cycle T, the following illustrative calculations are performed:

$$y[n-2]=-q_1*y[n-4]+Temp1[n-2]+Temp2[n-2]+Temp3[n-2]+Temp4[n-2];$$

$$y[n-1]=-q_1*y[n-3]+Temp1[n-1]+Temp2[n-1]+Temp3[n-1]+Temp4[n-1];$$

$$Temp1[n]=-q_2*y[n-4];$$

$$Temp2[n]=A*x[n];$$

$$Temp3[n]=p_1*x[n-1];$$

$$Temp4[n]=p_2*x[n-2];$$

$$Temp1[n+1]=-q_2*y[n-3];$$

$$Temp2[n+1]=A*x[n+1];$$

$$Temp3[n+1]=p_1*x[n];$$

$$Temp4[n+1]=p_2*x[n-1].$$

In cycle T+1, the following illustrative calculations are performed:

$$y[n]=-q_1*y[n-2]+Temp1[n]+Temp2[n]+Temp3[n]+Temp4[n];$$

$$y[n+1]=-q_1*y[n-1]+Temp1[n+1]+Temp2[n+1]+Temp3[n+1]+Temp4[n+1];$$

$$Temp1[n+2]=-q_2*y[n-2];$$

$$Temp2[n+2]=A*x[n+2];$$

$$Temp3[n+2]=p_1*x[n+1];$$

$$Temp4[n+2]=p_2*x[n];$$

$$Temp1[n+3]=-q_2*y[n-1];$$

$$Temp2[n+3]=A*x[n+3];$$

$$Temp3[n+3]=p_1*x[n+2];$$

$$Temp4[n+3]=p_2*x[n+1].$$

As seen from the above operations, implementation of the transformed BIIR filter utilizes ten multipliers during each processor cycle (one multiplier corresponding to each multiplication operation in a given processor cycle). The transformed BIIR approach thus advantageously improves calculation efficiency of the BIIR filter by about two times compared to a direct implementation of the BIIR filter shown in FIG. 3.

Figure 6:
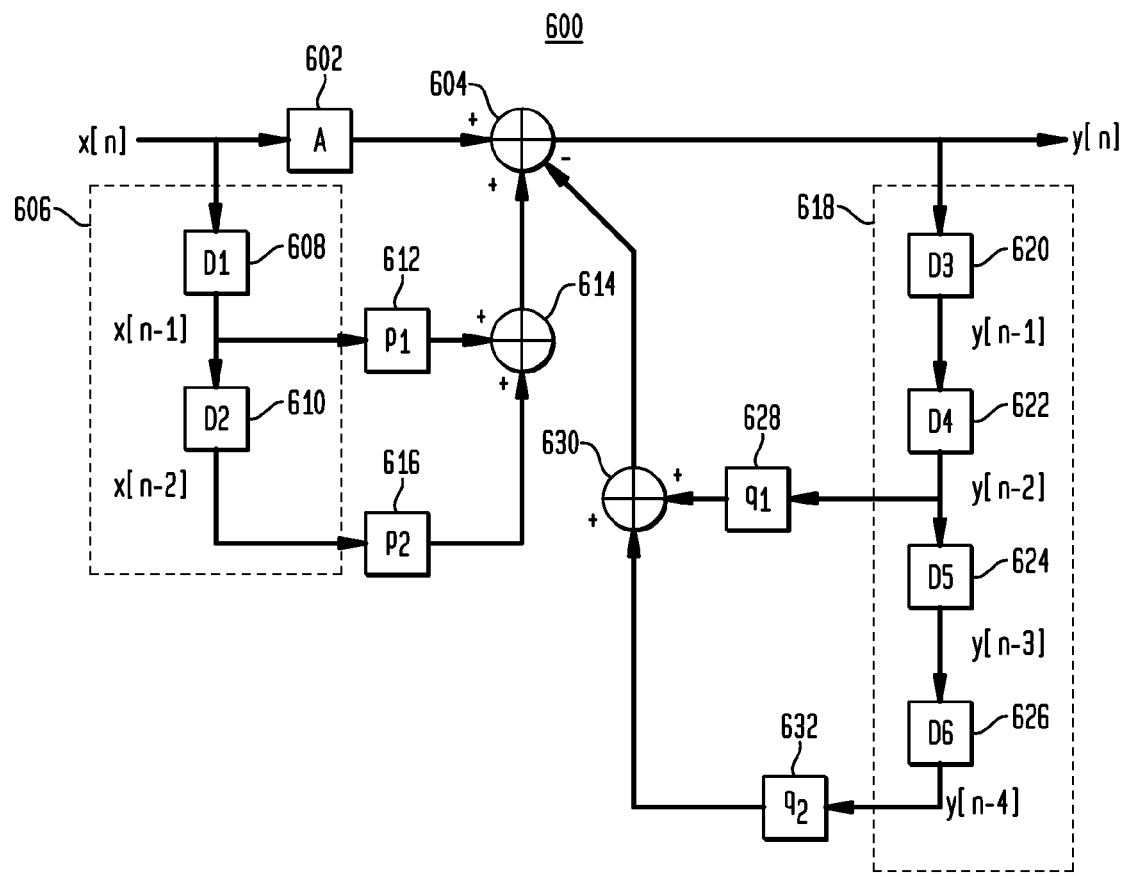
FIG. 6 is a block diagram depicting at least a portion of an exemplary BIIR filter circuit, according to an embodiment of the present invention.

FIG. 6 is a block diagram depicting at least a portion of an exemplary BIIR filter 600, according to an embodiment of the present invention. BIIR filter 600 is a functional implementation of the transformed BIIR filter represented by equation (7) above. More particularly, input sample x[n] is multiplied in block 602, which may be a scaling (e.g., attenuation or amplification) block, by a coefficient (i.e., constant) A to generate the signal Ax[n] supplied to a first summation block 604. Concurrently, the input sample x[n] is fed to a first delay line 606, which may be an input delay line, which includes first and second delay blocks 608 and 610, respectively, connected together in series. The first delay block 608, which has a delay D1 associated therewith, is operative to generate a delayed input sample x[n−1] which is multiplied in block 612 by a coefficient $p_1$ to generate the signal $p_1$x[n−1] supplied to a second summation block 614. The second delay block 610, which has a delay D2 associated therewith, is operative to generate a delayed input sample x[n−2] which is multiplied in block 616 by a coefficient $p_2$ to generate the signal $p_2$x[n−2] supplied to the second summation block 614. It is to be appreciated that the respective delays D1 and D2 associated with delay blocks 608 and 610, respectively, may be the same or different relative to one another, and the invention is not limited to any specific value of each delay. An output, $p_1$x[n−1]+$p_2$x[n−2], generated by summation block 614 is fed to summation block 604 where it is added to the signal Ax[n].

The output sample y[n] generated by summation block 604 is fed to a second delay line 618, which may be an output delay line. Delay line 618 includes a third delay block 620 having a delay D3 associated therewith, a fourth delay block 622 having a delay D4 associated therewith, a fifth delay block 624 having a delay D5 associated therewith, and a sixth delay block 626 having a delay D6 associated therewith. Delay block 620 is operative to generate a first delayed output sample y[n−1], delay block 622 is operative to generate a second delayed output sample y[n−2], delay block 624 is operative to generate a third delayed output sample y[n−3], and delay block 626 is operative to generate a fourth delayed output sample y[n−4].

The output sample y[n−2] generated by delay block 622 is multiplied in block 628 by a coefficient $q_1$ to generate a signal $q_1$y[n−2] which is then supplied to a third summation block 630 via a first feedback signal path. Concurrently, the output sample y[n−4] generated by delay block 626 is multiplied in block 632 by a coefficient $q_2$ to generate a signal $q_2$y[n−4] which is supplied to summation block 630 via a second feedback signal path. An output, $q_1$y[n−2]+$q_2$y[n−4], generated by summation block 630 is fed to summation block 604 where it is subtracted from the signal Ax[n]+$p_1$x[n−1]+$p_2$x[n−2] to generate the expression for the output sample y[n]=−$q_1$y[n−2]−$q_2$y[n−4]+Ax[n]+$p_1$x[n−1]+$p_2$x[n−2], as shown in equation (7). As will become apparent to those skilled in the art given the teachings herein, at least one of the first and second delay lines is preferably implemented using at least one shift register, digital signal processor and/or tapped delay line, although the invention is not limited to any specific delay line implementation.

The BIIR transformation according to embodiments of the invention described above can be extended in a general sense such that a dependency exists only between the calculation of samples y[n] and y[n−$2^k$], where k is a natural number. If multiply operations are performed in several pipeline stages, a higher degree of decoupling between samples can provide greater calculation efficiency. In a general case, in order to obtain a transformed BIIR filter transfer function H(z) of stage N, a transformation of stage N−1 is preferably multiplied by the following expression:

$$\frac{(1+b_1^N z^{-N})(1+b_2^N z^{-N})}{(1+b_1^N z^{-N})(1+b_2^N z^{-N})}, \qquad (8)$$

where N is an integer greater than or equal to two. As will become apparent to those skilled in the art given the teachings herein, it is straightforward to show that the expression set forth in equation (8) above adds poles inside the unit circle, and thus satisfies the BIBO stability criterion of the BIIR filter.

By way of example only and without loss of generality, assuming it is desired to extend the expression above to handle possible pipeline stalls, stage 2 of the novel BIIR transformation is calculated by inserting N=2 in equation (8) to yield the following expression:

$$\frac{(1+b_1^2 z^{-2})(1+b_2^2 z^{-2})}{(1+b_1^2 z^{-2})(1+b_2^2 z^{-2})}, \quad (9)$$

Both the numerator and denominator of the transfer function H(z) shown in equation (1) are multiplied by the expression in equation (9) to yield the following derivation:

$$H(z) = \frac{A(1+b_1 z^{-1})(1 \mp b_2 z^{-1})}{(1-b_1^2 z^{-2})(1-b_2^2 z^{-2})} \quad (10)$$

$$= \frac{A(1+b_1 z^{-1})(1 \mp b_2 z^{-1})(1+b_1^2 z^{-2})(1+b_2^2 z^{-2})}{(1-b_1^2 z^{-2})(1-b_2^2 z^{-2})(1+b_1^2 z^{-2})(1+b_2^2 z^{-2})}$$

$$H(z) = \frac{A + c_1 z^{-1} + c_2 z^{-2} + c_3 z^{-3} + c_4 z^{-4} + c_5 z^{-5} + c_6 z^{-6}}{1 + d_1 z^{-4} + q_2 z^{-8}},$$

where $c_1=A(b_1+b_2)$, $c_2=A(b_1^2+b_1 b_2+b_2^2)$, $c_3=A(b_1^3+b_1^2 b_2+b_1 b_2^2+b_2^3)$, $c_4=A(b_1^3 b_2+b_1^2 b_2^2+b_1 b_2^3)$, $c_5=A(b_1^3 b_2^2+b_1^2 b_2^3)$, $c_6=A(b_1^3 b_2^3)$, $d_1=-(b_1^2+b_2^2)$, and $q_2=(b_1^2 * b_2^2)$ in equation (10) above. Equation (10) can be rewritten in regression form as follows:

$$y[n]=-d_1 y[n-4]-q_2 y[n-8]+Ax[n]+c_1 x[n-1]+c_2 x[n-2]+c_3 x[n-3]+c_4 x[n-4]+c_5 x[n-5]+c_6 x[n-6] \quad (11)$$

Figure 7:
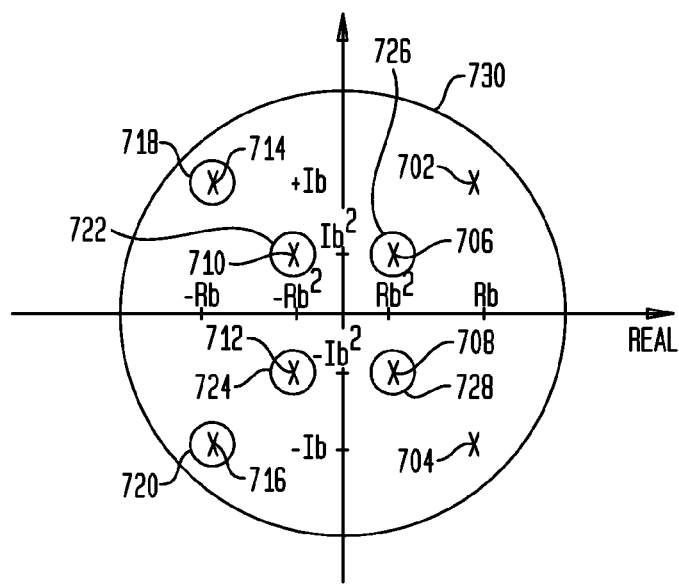
FIG. 7 is a graphical illustration depicting pole locations for an exemplary transformed BIIR filter, according to another embodiment of the invention.

FIG. 7 is a graphical illustration depicting pole locations for the exemplary transformed BIIR filter of equation (11), according to another embodiment of the invention. It can be easily shown that in the z-transform plane, the transformed BIIR filter in equation (11) will be represented as eight poles and six zeros, all poles being located within the boundary of the unit circle. With reference to FIG. 7, a first pole 702 is located at a position of $R_b$ on the real axis and $I_b$ on the imaginary axis, a second pole 704 is located at a position of $R_b$ on the real axis and $-I_b$ on the imaginary axis, a third pole 706 is located at a position of $R_b^2$ on the real axis and $I_b^2$ on the imaginary axis, a fourth pole 708 is located at a position of $R_b^2$ on the real axis and $-I_b^2$ on the imaginary axis, a fifth pole 710 is located at a position of $-R_b^2$ on the real axis and $I_b^2$ on the imaginary axis, a sixth pole 712 is located at a position of $-R_b^2$ on the real axis and $-I_b^2$ on the imaginary axis, a seventh pole 714 is located at a position of $-R_b$ on the real axis and $I_b$ on the imaginary axis, an eighth pole 716 is located at a position of $-R_b$ on the real axis and $-I_b$ on the imaginary axis, a first zero 718 is located at a position of $-R_b$ on the real axis and $I_b$ on the imaginary axis, a second zero 720 is located at a position of $-R_b$ on the real axis and $-I_b$ on the imaginary axis, a third zero 722 is located at a position of $-R_b^2$ on the real axis and $I_b^2$ on the imaginary axis, a forth zero 724 is located at a position of $-R_b^2$ on the real axis and $-I_b^2$ on the imaginary axis, a fifth zero 726 is located at a position of $R_b^2$ on the real axis and $I_b^2$ on the imaginary axis, and a sixth zero 728 is located at a position of $R_b^2$ on the real axis and $-I_b^2$ on the imaginary axis. As shown, the respective locations of all poles lie within the boundary of a unit circle 730, which is a fundamental requirement of any IIR filter since it assures filter stability.

Figure 8:
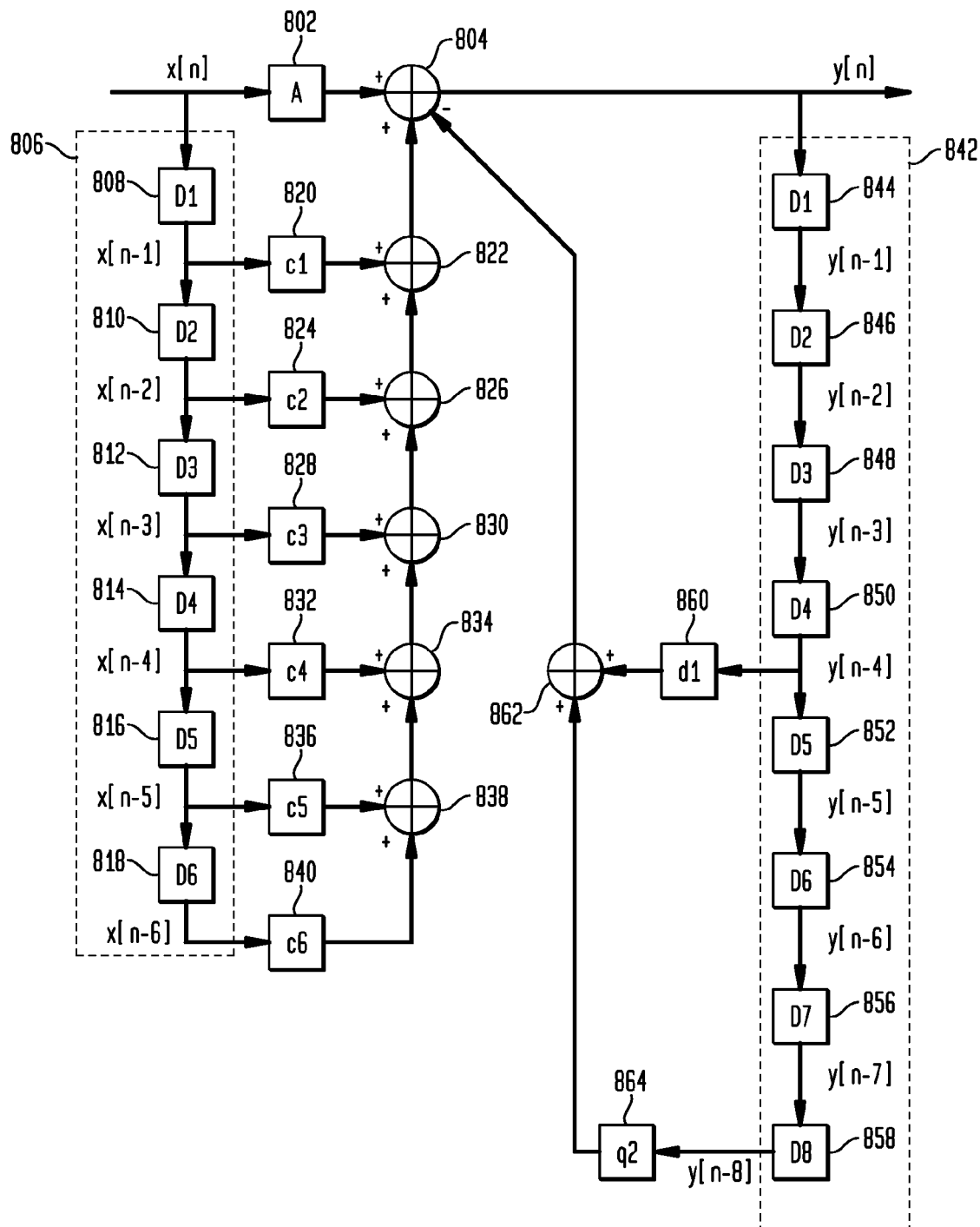
FIG. 8 is a block diagram depicting at least a portion of an exemplary BIIR filter circuit, according to another embodiment of the present invention.

FIG. 8 is a block diagram depicting at least a portion of an exemplary BIIR filter circuit 800, according to another embodiment of the present invention. BIIR filter 800 is a functional implementation of the transformed BIIR filter represented by equation (11) above. More particularly, input sample x[n] is multiplied in block 802 by a coefficient (i.e., constant) A to generate the signal Ax[n] supplied to a first summation block 804. Concurrently, the input sample x[n] is fed to a first delay line 806, which may be an input delay line, which includes a plurality of delay blocks (first through sixth) 808, 810, 812, 814, 816 and 818 connected together in series. The first delay block 808, which has a delay D1 associated therewith, is operative to generate a delayed input sample x[n−1] which is multiplied in block 820 by a coefficient $c_1$ to generate the signal $c_1 x[n-1]$ supplied to a second summation block 822. The second delay block 810, which has a delay D2 associated therewith, is operative to generate a delayed input sample x[n−2] which is multiplied in block 824 by a coefficient $c_2$ to generate the signal $c_2 x[n-2]$ supplied to a third summation block 826. The third delay block 812, which has a delay D3 associated therewith, is operative to generate a delayed input sample x[n−3] which is multiplied in block 828 by a coefficient $c_3$ to generate the signal $c_3 x[n-3]$ supplied to a fourth summation block 830. The fourth delay block 814, which has a delay D4 associated therewith, is operative to generate a delayed input sample x[n−4] which is multiplied in block 832 by a coefficient $c_4$ to generate the signal $c_4 x[n-4]$ supplied to a fifth summation block 834. The fifth delay block 816, which has a delay D5 associated therewith, is operative to generate a delayed input sample x[n−5] which is multiplied in block 836 by a coefficient $c_5$ to generate the signal $c_5 x[n-5]$ supplied to a sixth summation block 838. The sixth delay block 818, which has a delay D6 associated therewith, is operative to generate a delayed input sample x[n−6] which is multiplied in block 840 by a coefficient $c_6$ to generate the signal $c_6 x[n-6]$ supplied to the sixth summation block 838.

It is to be appreciated that the respective delays D1 through D6 associated with delay blocks 808 through 818, respectively, may be the same or different relative to one another, and the invention is not limited to any specific value of each delay. An output, $c_1 x[n-1]+c_2 x[n-2]+c_3 x[n-3]+c_4 x[n-4]+c_5 x[n-5]+c_6 x[n-6]$, generated by summation block 822 is fed to summation block 804 where it is added to the signal Ax[n].

The output sample y[n] generated by summation block 804 is fed to a second delay line 842, which may be an output delay line. Delay line 842 includes a first delay block 844 having a delay D1 associated therewith, a second delay block 846 having a delay D2 associated therewith, a third delay block 848 having a delay D3 associated therewith, a fourth delay block 850 having a delay D4 associated therewith, a fifth delay block 852 having a delay D5 associated therewith, a sixth delay block 854 having a delay D6 associated therewith, a seventh delay block 856 having a delay D7 associated therewith, and an eighth delay block 858 having a delay D8 associated therewith. Delay block 844 is operative to generate a first delayed output sample y[n−1], delay block 846 is operative to generate a second delayed output sample y[n−2], delay block 848 is operative to generate a third delayed output sample y[n−3], delay block 850 is operative to generate a fourth delayed output sample y[n−4], delay block 852 is operative to generate a fifth delayed output sample y[n−5], delay block 854 is operative to generate a sixth delayed output sample y[n−6], delay block 856 is operative to generate a seventh delayed output sample y[n−7], and delay block 858 is operative to generate an eighth delayed output sample y[n−8].

The output sample y[n−4] generated by delay block 850 is multiplied in block 860 by a coefficient $d_1$ to generate a signal $d_1 y[n-4]$ which is then supplied to a seventh summation block 860 via a first feedback signal path. Concurrently, the output sample y[n−8] generated by delay block 858 is multiplied in block 864 by a coefficient $q_2$ to generate a signal $q_2 y[n-8]$ which is supplied to summation block 862 via a second feedback signal path. An output, $d_1y[n-4]+q_2y[n-8]$, generated by summation block 862 is fed to summation block 804 where it is subtracted from the signal $Ax[n]+c_1x[n-1]+c_2x[n-2]+c_3x[n-3]+c_4x[n-4]+c_5x[n-5]+c_6x[n-6]$ to generate the expression for the output sample $y[n]=-d_1y[n-4]-q_2y[n-8]+Ax[n]+c_1x[n-1]+c_2x[n-2]+c_3x[n-3]+c_4x[n-4]+c_5x[n-5]+c_6x[n-6]$, as shown in equation (11). As will become apparent to those skilled in the art given the teachings herein, at least one of the first and second delay lines is preferably implemented using at least one shift register, digital signal processor and/or tapped delay line, although the invention is not limited to any specific delay line implementation.

The BIIR filter transformation defined in equations (10) and (11) above, and shown in FIGS. 7 and 8, utilizes nine multipliers per output and enables four output calculations to be performed concurrently (i.e., in parallel). Thus, assuming operation in a vector processor environment with sixteen multipliers and two pipeline stages for multiplier calculations, the above transformation achieves a throughput of 16/9=1.78 output samples per cycle, compared to ½=0.5 sample per cycle achieved using a standard BIIR filter implementation. In this exemplary embodiment, therefore, performance is advantageously improved by 1.78/0.5=3.56 times.

One or more embodiments of the invention or elements thereof may be implemented in the form of an article of manufacture including a machine readable medium that contains one or more programs which when executed implement such method step(s); that is to say, a computer program product including a tangible computer readable recordable storage medium (or multiple such media) with computer usable program code stored thereon in a non-transitory manner for performing the method steps indicated. Furthermore, one or more embodiments of the invention or elements thereof can be implemented in the form of an apparatus including a memory and at least one processor (e.g., vector processor) that is coupled with the memory and operative to perform, or facilitate the performance of, exemplary method steps.

As used herein, "facilitating" an action includes performing the action, making the action easier, helping to carry out the action, or causing the action to be performed. Thus, by way of example only and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Yet further, in another aspect, one or more embodiments of the invention or elements thereof can be implemented in the form of means for carrying out one or more of the method steps described herein; the means can include (i) hardware module(s), (ii) software module(s) executing on one or more hardware processors, or (iii) a combination of hardware and software modules; any of (i)-(iii) implement the specific techniques set forth herein, and the software modules are stored in a tangible computer-readable recordable storage medium (or multiple such media). Appropriate interconnections via bus, network, and the like can also be included.

Figure 9:
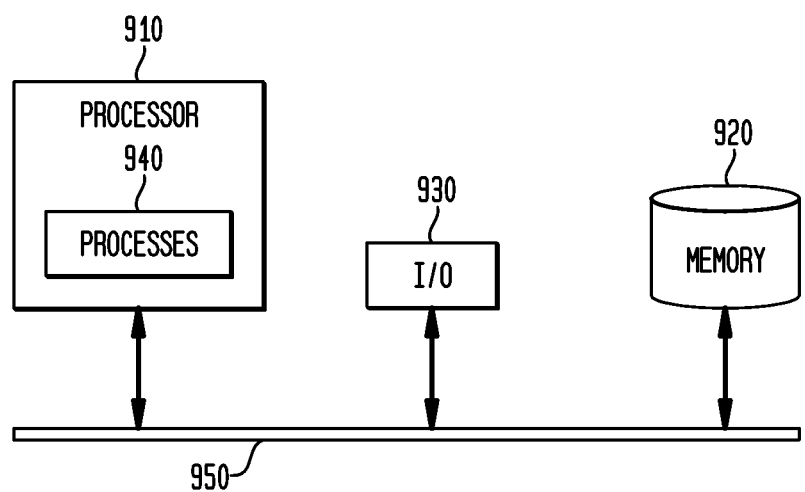
FIG. 9 is a block diagram depicting at least a portion of an exemplary processing system, formed in accordance with an aspect of the present invention.

Embodiments of the invention may be particularly well-suited for use in an electronic device or alternative system (e.g., communications system). For example, FIG. 9 is a block diagram depicting at least a portion of an exemplary processing system 900 formed in accordance with an embodiment of the invention. System 900, which may represent, for example, a BIIR system or a portion thereof, may include a processor 910, memory 920 coupled with the processor (e.g., via a bus 950 or alternative connection means), as well as input/output (I/O) circuitry 930 operative to interface with the processor. The processor 910 may be configured to perform at least a portion of the functions of the present invention (e.g., by way of one or more processes 940 which may be stored in memory 920), illustrative embodiments of which are shown in the previous figures and described herein above.

It is to be appreciated that the term "processor" as used herein is intended to include any processing device, such as, for example, one that includes a CPU and/or other processing circuitry (e.g., digital signal processor (DSP), network processor, microprocessor, etc.). Additionally, it is to be understood that a processor may refer to more than one processing device, and that various elements associated with a processing device may be shared by other processing devices. For example, in the case of BIIR filter circuit 600 shown in FIG. 6, each of the delay elements 608, 610, 620, 622, 624 and 626 may be implemented in parallel (i.e., concurrently) using a separate corresponding DSP core, as in a distributed computing configuration. The term "memory" as used herein is intended to include memory and other computer-readable media associated with a processor or CPU, such as, for example, random access memory (RAM), read only memory (ROM), fixed storage media (e.g., a hard drive), removable storage media (e.g., a diskette), flash memory, etc. Furthermore, the term "I/O circuitry" as used herein is intended to include, for example, one or more input devices (e.g., keyboard, mouse, etc.) for entering data to the processor, and/or one or more output devices (e.g., display, etc.) for presenting the results associated with the processor.

Accordingly, an application program, or software components thereof, including instructions or code for performing the methodologies of the invention, as described herein, may be stored in a non-transitory manner in one or more of the associated storage media (e.g., ROM, fixed or removable storage) and, when ready to be utilized, loaded in whole or in part (e.g., into RAM) and executed by the processor. In any case, it is to be appreciated that at least a portion of the components shown in the previous figures may be implemented in various forms of hardware, software, or combinations thereof (e.g., one or more DSPs with associated memory, application-specific integrated circuit(s) (ASICs), functional circuitry, one or more operatively programmed general purpose digital computers with associated memory, etc). Given the teachings of the invention provided herein, one of ordinary skill in the art will be able to contemplate other implementations of the components of the invention.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

An integrated circuit in accordance with the present invention can be employed in essentially any application and/or electronic system in which BIIR systems may be employed. Suitable systems for implementing techniques of the invention may include, but are not limited to, mobile phones, personal computers, wireless communication networks, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A biquad infinite impulse response (BIIR) system, comprising:
    a first delay line configured to receive at least one input data sample and to generate a plurality of delayed input samples as a function of the input data sample;
    a second delay line including a plurality of delay elements connected together in a series configuration, an input of a first one of the delay elements receiving at least one output data sample of the BIIR system, the second delay line configured to generate a plurality of delayed output samples; and
    a summation element configured to generate the at least one output data sample of the BIIR system as a function of an addition of at least a first signal and a second signal and a subtraction of at least a third signal, the third signal comprising at least a first delayed output sample generated by the second delay line multiplied by a first prescribed value, the first delayed output sample and the at least one output data sample of the BIIR system being temporally nonadjacent to one another, whereby the BIIR system is configured to eliminate a dependency between the at least one output data sample of the BIIR system and a temporally adjacent delayed output sample generated by the second delay line.

2. The system of claim 1, wherein the third signal comprises a summation of at least the first delayed output sample multiplied by the first prescribed value and a second delayed output sample generated by the second delay line multiplied by a second prescribed value.

3. The system of claim 2, wherein the second signal comprises a summation of at least a first delayed input sample generated by the first delay line multiplied by a third prescribed value and a second delayed input sample generated by the first delay line multiplied by a fourth prescribed value.

4. The system of claim 3, wherein the first signal comprises the input data sample multiplied by a fifth prescribed value.

5. The system of claim 4, wherein multiplication of the respective delayed input samples and delayed output samples by their corresponding prescribed values is performed concurrently in a distributed processing manner.

6. The system of claim 4, wherein the system is configured to implement a BIIR filter, the first, second, third, fourth and fifth prescribed values being respective coefficients of the BIIR filter.

7. The system of claim 3, further comprising at least one adder configured to generate the second signal as a sum of the first delayed input sample generated by the first delay line multiplied by the third prescribed value and the second delayed input sample generated by the first delay line multiplied by the fourth prescribed value.

8. The system of claim 2, further comprising at least one adder configured to generate the third signal as a sum of at least the first delayed output sample multiplied by the first prescribed value and the second delayed output sample generated by the second delay line multiplied by the second prescribed value.

9. The system of claim 1, wherein the at least one output data sample of the BIIR system is fed through at least two of the plurality of delay elements in the second delay line to generate the first delayed output sample.

10. The system of claim 1, wherein the delay elements in the second delay line have respective delay values associated therewith that are equal to one another.

11. The system of claim 1, wherein the delay elements in the second delay line have respective delay values associated therewith, at least two of the delay values being different relative to one another.

12. The system of claim 1, wherein the first delay line comprises a plurality of delay elements, the delay elements in the first delay line having respective delay values associated therewith that are equal to one another.

13. The system of claim 1, wherein the plurality of delay elements in the second delay line comprises the first delay element, a last delay element and at least one intermediate delay element connected between the first and last delay elements.

14. The system of claim 1, wherein the system is adapted to receive a first data stream including the at least one input data sample and is operative to generate a second data stream comprising the at least one output data sample.

15. The system of claim 1, wherein the system is configured to implement a BIIR filter.

16. An integrated circuit including at least one biquad infinite impulse response (BIIR) system, the at least one BIIR system comprising:
    a first delay line configured to receive at least one input data sample and to generate a plurality of delayed input samples as a function of the input data sample;
    a second delay line including a plurality of delay elements connected together in a series configuration, an input of a first one of the delay elements receiving at least one output data sample of the at least one BIIR system, the second delay line configured to generate a plurality of delayed output samples; and
    a summation element configured to generate the at least one output data sample of the BIIR system as a function of an addition of at least a first signal and a second signal and a subtraction of at least a third signal, the third signal comprising at least a first delayed output sample generated by the second delay line multiplied by a first prescribed value, the first delayed output sample and the at least one output data sample of the BIIR system being temporally nonadjacent to one another, whereby the BIIR system is configured to eliminate a dependency between the at least one output data sample of the BIIR system and a temporally adjacent delayed output sample generated by the second delay line.

17. The integrated circuit of claim 16, wherein the third signal comprises a summation of at least the first delayed output sample multiplied by the first prescribed value and a second delayed output sample generated by the second delay line multiplied by a second prescribed value.

18. The integrated circuit of claim 17, wherein the second signal comprises a summation of at least a first delayed input sample generated by the first delay line multiplied by a third prescribed value and a second delayed input sample generated by the first delay line multiplied by a fourth prescribed value.

19. The integrated circuit of claim 17, wherein the at least one BIIR system further comprises at least one adder configured to generate the third signal as a sum of at least the first delayed output sample multiplied by the first prescribed value and the second delayed output sample generated by the second delay line multiplied by the second prescribed value.

20. The integrated circuit of claim 16, wherein the plurality of delay elements in the second delay line have respective delay values associated therewith that are equal to one another.

21. A method of implementing a biquad infinite impulse response (BIIR) system, the method comprising the steps of:
   generating, with a processor, a plurality of delayed input samples as a function of an input data sample received by the BIIR system;
   generating, with the processor, a plurality of delayed output samples as a function of at least one output data sample of the BIIR system;
   generating, with the processor, the output data sample of the BIIR system by summing at least a first signal and a second signal and subtracting at least a third signal, the third signal comprising at least a first one of the plurality of delayed output samples multiplied by a first prescribed value, the first one of the plurality of delayed output samples and the at least one output data sample of the BIIR system being temporally nonadjacent to one another, thereby eliminating a dependency between the at least one output data sample of the BIIR system and a temporally adjacent delayed output sample.

* * * * *